United States Patent

Kotani et al.

[11] Patent Number: 5,432,488
[45] Date of Patent: Jul. 11, 1995

[54] ELECTRICAL SIGNAL FILTER

[75] Inventors: Osamu Kotani; Satoshi Komiyama, both of Atsugi, Japan

[73] Assignee: Mitsumi Electric Co., Ltd., Chofu, Japan

[21] Appl. No.: 175,261

[22] Filed: Dec. 29, 1993

[30] Foreign Application Priority Data

Dec. 29, 1992 [JP] Japan .................. 4-093615

[51] Int. Cl.$^6$ .................. H03H 7/01; H03H 7/12
[52] U.S. Cl. .................. 333/167; 333/176; 333/185
[58] Field of Search .................. 333/167, 176, 181–185, 333/12, 175

[56] References Cited

U.S. PATENT DOCUMENTS

| | | | |
|---|---|---|---|
| 4,451,803 | 5/1984 | Holdsworth et al. | 333/185 X |
| 4,701,726 | 10/1987 | Holdsworth | 333/185 |
| 4,758,808 | 7/1988 | Sasaki et al. | 333/185 |
| 4,820,202 | 4/1989 | Edwards et al. | 333/185 X |
| 4,845,447 | 7/1989 | Holdsworth | 333/185 X |
| 4,901,043 | 2/1990 | Palinkas | 333/176 X |
| 5,150,087 | 9/1992 | Yoshie et al. | 333/185 |
| 5,278,525 | 1/1994 | Palinkas | 333/185 X |

FOREIGN PATENT DOCUMENTS

| | | |
|---|---|---|
| 2-9486 | 1/1990 | Japan . |
| 2-27780 | 2/1990 | Japan . |
| 2-27785 | 2/1990 | Japan . |

*Primary Examiner*—Seungsook Ham
*Attorney, Agent, or Firm*—Knobbe, Martins, Olson & Bear

[57] ABSTRACT

The object of this invention is to provide an electrical signal filter for improving electrical characteristics and reliability of the electrical signal filter for use in a cable television by protecting it from moisture. In an electrical signal filter having a filter portion provided inside a cylinder-shaped shield case, the filter portion includes a first filter circuit and a second filter circuit respectively mounted on circuit boards, and a shield member arranged between the first filter and the second filter. In the electrical signal filter, a moisture-proof material is applied to an entire surface of the filter portion and a contact area where the cylinder-shaped shield case containing the circuit boards and the filter portion therein contacts external components.

7 Claims, 2 Drawing Sheets

ELECTRICAL SIGNAL FILTER

BACKGROUND OF THE INVENTION

This invention relates to an electrical signal filter, and particularly is directed to an electrical signal filter for improving electrical characteristics and reliability of the electrical signal filter, for use in a cable television in particular, by protecting it from moisture.

A cable television (hereinafter referred to as CATV) has multiple channels and a viewer enters into a contract with a cable television broadcast service and the television signals are then transmitted to his/her household. Some of these channels can be viewed upon the payment of an additional subscription fee. Normally, channels for which an additional fee is to be paid are provided with electrical signal filters (trap filters) in a cable of the CATV, so that signals having a particular frequency are cut. The system is configured so that the channel for which said additional payment has been made is supplied to the household after this electrical signal filter has been removed.

FIG. 3 explains a conventional electrical signal filter. As shown in the drawing, an electrical signal filter is comprised of a first circuit board 2, a second circuit board 3, a shield member 4, and a shield case 5. Filter circuits are provided to each of the first and second circuit boards 2 and 3, so that signals of channels having a particular frequency are cut thereby.

The shield member 4 is made of a metal plate and accommodated between the first and second circuit boards 2 and 3. The shield member 4 is to function to electro-magnetically isolate the filter circuits provided in each circuit board 2 and 3 in the shield case 5.

The first circuit board 2, the second circuit board 3 and the shield member 4, arranged in line, are provided in the shield case 5.

The shield case 5 consists of an inner case 5a and an outer case 5b. A female connector 6 is provided to the inner case 5a. A male connector 7 is provided to the outer case 5b.

In a configuration of the conventional electrical signal filter, the filter circuits which are composed of coils and condensers are merely soldered on the first and second circuit boards 2 and 3, respectively. As described in above, the conventional electrical signal filter is simply dually shielded by the inner and outer cases 5a and 5b, as well as a Printed Circuit Board. This is insufficient in terms of a protection from moisture. Since the signal filter and its accompanying cables are commonly used in the outdoor and thus susceptible to an influence of moisture, there are always some problems in the electrical characteristic and the reliability of the signal filter.

SUMMARY OF THE PRESENT INVENTION

In order to solve the above-mentioned problem, the present invention is designed to provide an electrical signal filter having a filter portion, in which a shield member is provided between a first and second filter circuits, provided in the inside of a cylinder-shaped shield case, wherein a moisture-proof material is applied throughout said filter surface.

It the present invention, it is preferred to apply the moisture-proof material to an area where the cylinder-shaped shield case containing the filter portion therein contacts an external component.

With the above-mentioned configuration, the electrical signal filter of the present invention can completely shut out moisture from the contact area of the cylinder-shaped shield case, containing the filter portion therein, with the external component. Therefore, the electrical characteristic of the electrical signal filter can be maintained, and the reliability and stability of the component are also guaranteed.

DETAILED DESCRIPTION OF THE INVENTION

Figure 1:
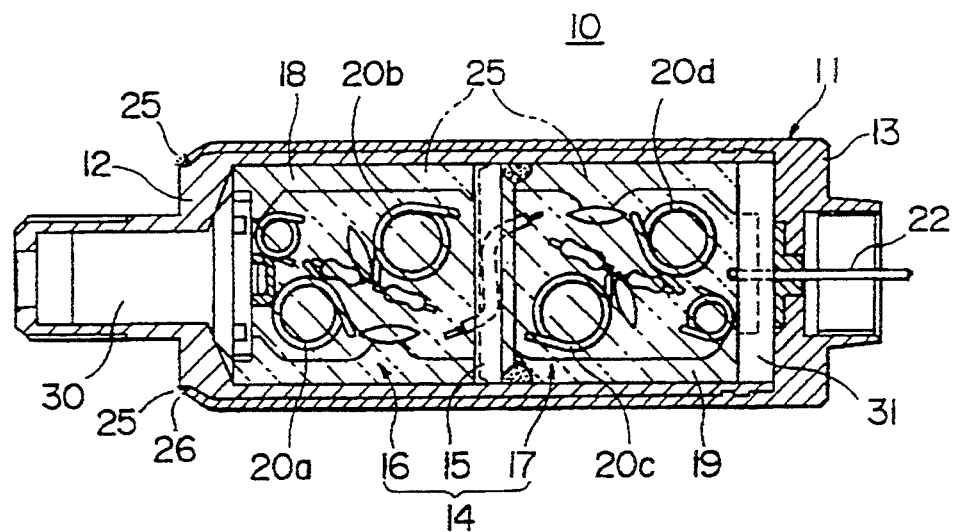
FIG. 1 is a top view of one embodiment of the present invention.
Figure 2:
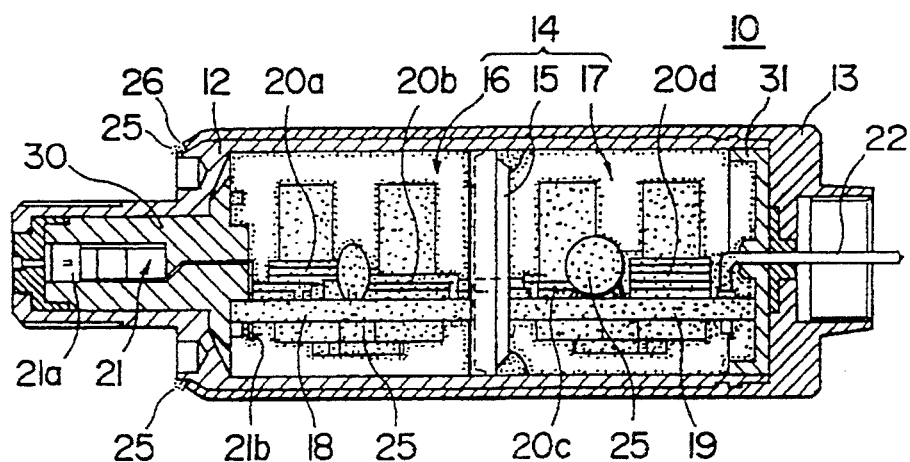
FIG. 2 is a cross sectional view of the present invention.
Figure 3:
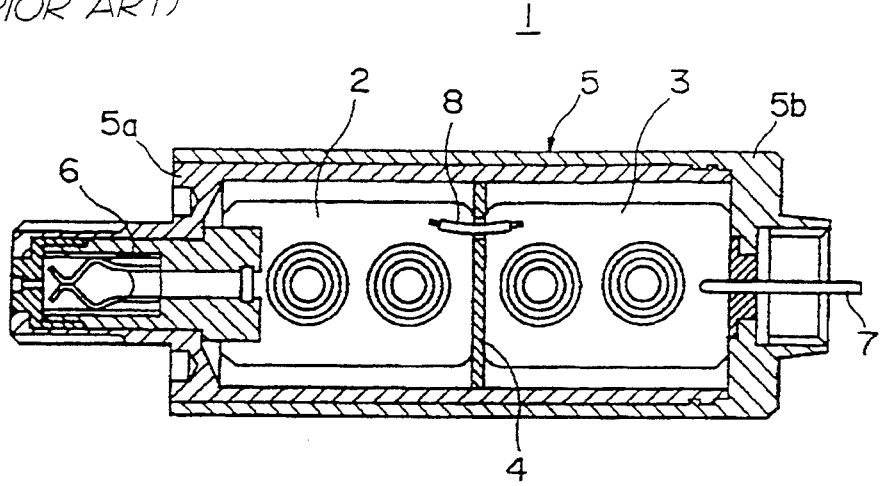
FIG. 3 is a cross sectional view showing an electrical signal filter of the conventional invention.

Next, one preferred embodiment of the present invention is described in reference to drawings. One embodiment of the present invention is shown in FIGS. 1 and 2.

An electrical signal filter 10 comprises a cylinder-shaped input side (inner) case 12 and the output side (outer) case 13, wherein a filter portion 14 is designed to be provided inside the inner case 12.

The filter portion 14 is comprised of a first filter circuit 16 and a second filter circuit 17. The first filter circuit 16 is provided on a first circuit board 18. The second filter circuit 17 is provided on a second circuit board 19. The first circuit board 18 and the second circuit board 19 are mechanically attached to a shield member 15 which electrically shields the first and second circuit boards 18 and 19 from one another.

The first and second filter circuits 16 and 17 are LC circuits which are comprised of coils 20a–20d. Each circuit is connected to a print pattern (not shown) formed on the circuit boards 18 and 19. The coils 20a–20d have a structure which is able to adjust their inductance value. Such an adjustment of the inductance is preferably performed after providing a moisture-proof material which will be described later.

Reference numeral 21 is an input side contact which is comprised of a contact part 21a and a connecting piece 21b. The contact part 21a holds a connector pin or a wire (not shown) to be inserted to the inner case 12 with the clamping effect of a plate spring. The connecting piece 21b is bent in a L-shape and soldered on the circuit board 18. The input side contact 21 is provided inside a holder 30 made of resin which is mounted on the first circuit board 18. Reference numeral 22 is an output side contact pin. One end of the contact pin 22 is soldered on the second circuit board 19, and the other end is bent in a L-shape and extended to the output side. Reference numeral 31 is a cap holding the output side contact pin 22 through the opening of the inner case 12.

According to the above-mentioned configuration, the present invention is characterized in that: the moisture-proof material 25 is applied by a brush or an atomizer to the entire filter portion 14, i.e., the first and second filter circuits 16 and 17 which are comprised of the LC circuits consisting of the coils 20a–20d and the condensers, as well as to print patterns formed on the circuit boards 18 and 19.

An application of the moisture-proof material 25 is performed as follows:

First, the first and second circuits 16 and 17 consisting of the coils 20a–20d and the condensers are mounted and soldered respectively on the circuit boards 18 and 19. Then, the circuit boards 18 and 19 are integrally connected by the shield member 15. Before the filter portion 14 is inserted in the input side (inner) case 12, the moisture-proof material 25 is applied to the entire surface of the circuit boards 18 and 19 by a brush or an atomizer. It is also possible to apply the moisture-proof material 25 by using the atomizer through the opening of the inner case 12, while the filter portion 14, to which the moisture-proof material 25 is initially applied, is being inserted in the inner case 12.

Furthermore, the present invention is characterized in that: the filter portion 14 is stored inside the inner case 12; and, the cylinder-shaped input side (inner) case 12 is inserted in the output side (outer) case 13. Thus, the shield case 11 has a dual protection against the moisture with the cases 12 and 13. Further, the moisture-proof material 25 is applied by a brush or an atomizer on a contact portion 26 where the input side (inner) case 12 and the output side (outer) case 13 are exposed to the outside.

As has been mentioned in the foregoing, the present invention adopts the application of the moisture-proof material 25. Therefore, it is possible to shut out moisture from the first and second filter circuits 16 and 17 which are comprised of LC circuits containing the coils 20a–20d and the condensers. Furthermore, changes of a central frequency of the trap filter can be prevented and thereby the characteristic can be maintained.

It is also possible to provide a foaming agent or a cushioning material inside the inner case 12 so as to correspond to changes in degrees of moisture in environment. It is needless to say that a moisture-proof performance can be improved if the moisture-proof material is applied on the contact areas where the shield case 11 contacts the input side contact 21 and the output side contact 22, i.e., the external components.

As has been described in above, the present invention provides an electrical signal filter having consistent electrical characteristics and reliability by applying the moisture-proof material so as to shield the contact area where the filter portion contacts external components.

What is claimed:

1. An electrical signal filter having a filter portion provided in a cylinder-shaped shield case, said filter portion being formed of a first filter circuit and a second filter circuit respectively mounted on circuit boards, and a shield member arranged between the first filter and the second filter, wherein:
    a surface of said filter portion is thoroughly coated by a thin film of a moisture-proof material; and
    an inner space formed by said filter portion and said cylinder-shaped shield case is filled with foaming agents.

2. An electrical signal filter having a filter portion provided in a cylinder-shaped shield case, said filter portion being formed of a first filter circuit and a second filter circuit respectively mounted on circuit boards, and a shield member arranged between the first filter and the second filter, wherein:
    an area where said filter portion contacts with said cylinder-shaped shield case is provided with a coating film made of a moisture-proof material; and
    an inner space formed by said filter portion and said cylinder-shaped shield case is filled with foaming agents.

3. An electrical signal filter as defined in claim 2, wherein:
    a surface of said filter portion is thoroughly covered with a coating film made of a moisture-proof material.

4. A method of assembling an electrical signal filter comprising the following steps of:
    mounting a filter portion on a space provided in a cylinder-shaped shield case;
    forming a thin film of moisture-proof material on a surface of said filter portion; and
    filling foaming agents in an inner space formed by said filter portion and said cylinder-shaped shield case.

5. A method of assembling an electric signal filter as defined in claim 4, further including the step of:
    covering an area where said filter portion attaches to said cylinder-shaped shield case with a coating film made of a moisture-proof material.

6. A method of assembling an electric signal filter as defined in claim 5, wherein said film is formed by spraying said moisture-proof material on said filter portion and said area.

7. A method of assembling an electric signal filter as defined in claim 5, wherein said film is formed by brushing said moisture-proof material on said filter portion and said area.

* * * * *